US007822346B2

(12) United States Patent  (10) Patent No.: US 7,822,346 B2
Rosenberg  (45) Date of Patent: Oct. 26, 2010

(54) MODULE HOUSING FOR CONNECTING OPTO-ELECTRONIC SUB-ASSEMBLIES

(75) Inventor: Paul K. Rosenberg, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 796 days.

(21) Appl. No.: 11/024,204

(22) Filed: Dec. 28, 2004

(65) Prior Publication Data

US 2006/0140640 A1   Jun. 29, 2006

(51) Int. Cl.
  *H04B 10/00* (2006.01)
  *H04B 10/12* (2006.01)
(52) U.S. Cl. .................. 398/138; 398/135; 398/164
(58) Field of Classification Search ............ 398/116, 398/117, 135, 138, 164; 385/88, 92, 94
  See application file for complete search history.

(56) References Cited

U.S. PATENT DOCUMENTS 4,468,074 A * 8/1984 Gordon .................. 439/296
5,199,882 A * 4/1993 Bates et al. .............. 439/67
6,206,582 B1 * 3/2001 Gilliland ................. 385/92
6,499,890 B2 * 12/2002 Gilliland et al. .......... 385/88
6,614,659 B2 * 9/2003 Feigenbaum et al. ..... 361/719
6,939,143 B2 * 9/2005 Rathburn ................. 439/66
7,114,857 B1 * 10/2006 Kayner et al. ............ 385/88
7,127,142 B2 * 10/2006 Miyamae et al. ......... 385/49
2003/0091349 A1 * 5/2003 Sato et al. ............... 398/135

* cited by examiner

*Primary Examiner*—Ken N Vanderpuye
*Assistant Examiner*—Daniel G Dobson
(74) *Attorney, Agent, or Firm*—Workman Nydegger

(57) ABSTRACT

This disclosure generally concerns modules. In one example, a module includes a housing, a printed circuit board, and an optical subassembly. The housing has a first part and a second part, with the second part holding the printed circuit board and optical subassembly. The printed circuit board has a contact element located near one end of the printed circuit board. The optical subassembly includes a connector which has a free end. The free end of the connector and the contact element of the printed circuit board are pinched together when the first and second parts of the housing are joined, thus forming an electrical connection.

6 Claims, 2 Drawing Sheets

MODULE HOUSING FOR CONNECTING OPTO-ELECTRONIC SUB-ASSEMBLIES

BACKGROUND OF THE INVENTION

1. The Field of the Invention

This invention relates generally to housings for electrical devices. More particularly, exemplary embodiments of the present invention concern the use of housing structure to electrically connect components disposed within the housing.

2. Related Technology

Optical networking and telecommunication is increasingly employed as a method by which information can be reliably transmitted via a communications network. Networks employing optical networking and telecommunication technology are known as optical communications networks, and are marked by high bandwidth and reliable, high-speed data transmission. More recently, the discrete optical components or devices in such networks have become less expensive and are capable of being used with networks having increasing data transmission rates. In order to minimize cost and maximize efficiency, low cost alternatives for the manufacture of optical components have become increasingly more desirable.

One way in which efficiency in assembling optical components can be improved concerns the establishment of electrical connections between opto-electronic sub-assemblies, such as those present in an optical module, and other components disposed within the module, such as printed circuit boards. Typically, an optical module includes an optical sub-assembly, a connector for connecting electronic components to the optical subassembly, and a printed circuit board. These components must be configured and arranged so that the connector and the printed circuit board are in permanent contact. Various methods and devices have been employed to implement such connections. As discussed below, however, typical methods and devices suffer from various problems and shortcomings.

One widely used method for electrically connecting opto-electronic sub-assemblies is to permanently attach the opto-electronic sub-assemblies by soldering the opto-electronic sub-assemblies together. The opto-electronic sub-assemblies are brought together at the desired connection point and a soldering process makes the connection. Although connection of the parts through soldering is relatively simple, there are several drawbacks to this technique. High temperatures associated with the soldering process can damage optical components or create problems in soldered connections of components which were attached prior to soldering the optical components. In addition, if the soldering is performed incorrectly, contact failure or a short circuit may occur. Soldering processes also take longer to perform, are more costly, and require special equipment which other processes for connecting components may not require.

Another method for electrically connecting opto-electronic sub-assemblies, particularly when attaching the opto-electronic sub-assemblies to a transceiver, involves the use of connectors. The use of connectors has some advantages over a soldered connection. For example, high temperatures do not threaten the integrity of a connection made with connectors. Also, components which are connected via connectors can be readily disconnected, allowing parts to be replaced. Unfortunately, however, connectors also present problems when used to connect opto-electronic sub-assemblies. For example, the manufacture of devices that require connectors to secure connections can be time consuming and tedious.

Exemplary embodiments of the present invention overcome these and other problems by electrically connecting components, such as opto-electronic sub-assemblies, without the need for solder or fasteners. By eliminating the need for attachment, exemplary embodiments of the present invention provide an efficient, low-cost, reliable way of securing contact between, for example, an opto-electronic subassembly and a printed circuit board.

BRIEF SUMMARY OF AN EXEMPLARY EMBODIMENT OF THE INVENTION

Embodiments of the present invention are generally directed to a module that includes a housing configured to electrically connect components, such as opto-electronic sub-assemblies, to other components contained within the housing. In one exemplary embodiment, a bottom part of the housing and a top part of the housing are initially unattached. The bottom part of the housing holds a printed circuit board within the housing. The printed circuit board includes a contact element located near one end of the printed circuit board.

Also held within the bottom part of the housing is an opto-electronic sub-assembly. The opto-electronic sub-assembly includes a connector having a free end and arranged within the bottom part of the housing in a position such that the free end of the connector is positioned proximate the contact element of the printed circuit board.

The top part of the housing includes an arm which extends toward the bottom part of the housing. When the top part of the housing and the bottom part of the housing are joined together, the arm pinches the free end of the connector and the contact element of the printed circuit board together, thus forming an electrical connection between the free end of the connector and the contact element. In this way, the need for soldering or mechanically fastening the components together is eliminated, thus reducing the time and cost associated with assembly of the module.

These and other aspects of embodiments of the invention will become more fully apparent from the following description and appended claims.

BRIEF DESCRIPTION OF THE DRAWINGS

To further clarify the above and other aspects of embodiments of the present invention, a more particular description of the invention will be rendered by reference to specific embodiments thereof which are illustrated in the appended drawings. These drawings depict only typical embodiments of the invention and are therefore not to be considered limiting of its scope. In addition, the figures depicted in the drawings are not drawn to scale. The invention will be described and explained with additional specificity and detail through the use of the accompanying drawings in which.

DETAILED DESCRIPTION OF EXEMPLARY EMBODIMENTS OF THE INVENTION

In general, embodiments of the present invention are directed to a module that includes a housing configured to electrically connect components such as opto-electronic sub-assemblies to other components. By using the housing itself to secure the sub-assemblies together, so that an electrical connection is thereby established between the opto-electronic sub-assembly and one or more other components, exemplary embodiments of the present invention eliminate, in some cases, the need for the use of other methods of connecting opto-electronic sub-assemblies and thus create an efficient and low-cost method for forming electrical connections. In one exemplary embodiment, an electrical device within the housing includes a component with a connector, and a printed circuit board. Complementary portions of the housing cooperate with each other to pinch the connector and the printed circuit board together so that an electrical connection is formed between the connector and the printed circuit board.

Note that while reference is made herein to the use of a module housing in the electrical connection of opto-electronic subassemblies to components such as printed circuit boards, the scope of the invention is not so limited. Rather, embodiments of the module housing, or other housings, may be employed to electrically connect a wide variety of other components as well.

Figure 1:
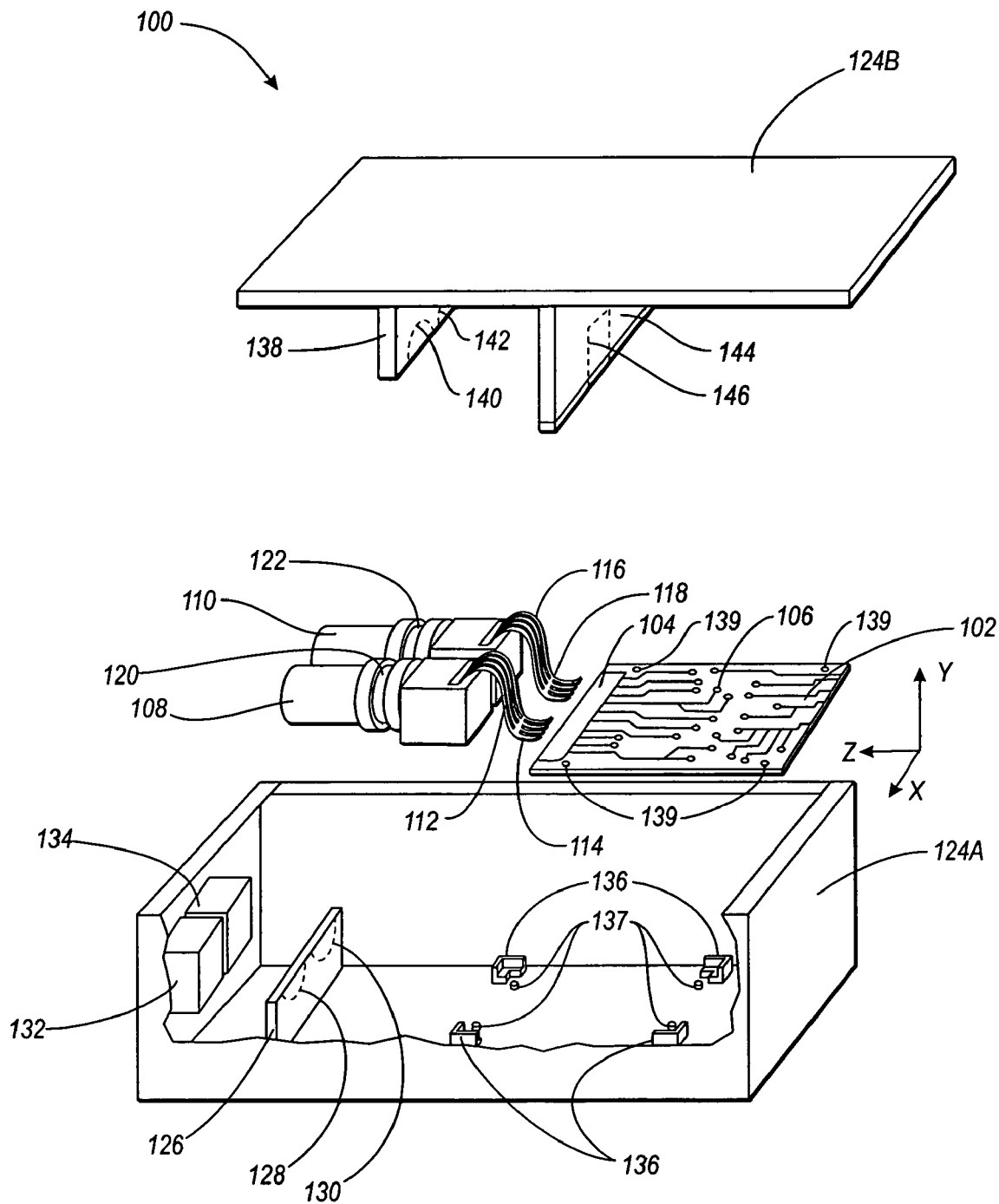
FIG. 1 is an exploded perspective view showing an exemplary housing, a receiver optical sub-assembly, a transmitter optical sub-assembly, and a printed circuit board.

FIG. 1 shows an exploded perspective view of a module 100. The module 100 is an optoelectronic module in some implementations, and an electronic module in others. More generally, the scope of the invention is not limited to any particular type of module.

The exemplary module 100 includes a printed circuit board ("PCB") 102. Located near one end of PCB 102 is contact element 104 which electronically communicates with electronic circuitry 106 of PCB 102. Electronic circuitry 106 is generally configured and arranged to implement various module 100 functions. Accordingly, exemplary circuitry 106 includes, but is not limited to, laser drivers, post amplifiers, and amplification, digital diagnostics, and associated circuitry. Among other things, the contact element 104 forms a portion of an electrical path between the electronic circuitry 106 and other systems, circuitry, and devices.

Examples of such devices, illustrated in FIG. 1, include a transmitter optical sub-assembly (TOSA) 108 and a receiver optical sub-assembly (ROSA) 110. The exemplary TOSA 108 includes an electrical connector 112, having a free end 114, which extends from TOSA 108. Likewise, exemplary ROSA 110 includes an electrical connector 116, having a free end 118, which extends from ROSA 110. In one embodiment, TOSA 108 defines a notch 120 and ROSA 110 defines a notch 122. The notches 120 and 122, or comparable structural elements, generally facilitate precise positioning, placement and retention of the TOSA 108 and ROSA 110, respectively, within the module 100 so that those components can be readily interconnected with each other and with corresponding optical fibers (not shown). As suggested earlier, embodiments of the invention are not limited for use with modules that include a ROSA and/or TOSA but, more generally, extend to modules that include any of a variety of other electrical and/or optoelectronic sub-assemblies, devices, systems and components.

The exemplary optoelectronic sub-assemblies TOSA 108 and ROSA 110 are located within a housing 124 of the module 100. As discussed in further detail below, a bottom part 124A of the housing 124 cooperates with a top part 124B of the housing 124 to hold opto-electronic sub-assemblies in place and to establish an electrical connection between the TOSA 108 and ROSA 110. It should be noted that the terms "bottom" and "top" used herein are relative terms used to describe the relationship between two pieces of the housing 124 and are not limitations of scope or function.

With continuing attention to FIG. 1, the bottom part 124A of the housing 124 includes an engagement member 126, or any other structure(s) of comparable functionality, to facilitate positioning and retention of a component, such as TOSA 108 for example, within the housing 124. As shown in the embodiment illustrated in FIG. 1, the exemplary engagement member 126 is configured to help position and retain two optical subassemblies, TOSA 108 and ROSA 110, within the housing 124. The engagement member 126 can also include curved portions, as shown in FIG. 1 by phantom lines 128 and 130. More generally, the engagement member 126, or comparable structure(s), can be configured as necessary for engagement with a device that is to be positioned within a housing such as housing 124.

In one embodiment of the invention, as shown in FIG. 1, notch 120 of TOSA 108 and notch 122 of ROSA 110 cooperate with engagement member 126 to hold TOSA 108 and ROSA 110, respectively, within the housing 124 and to constrain movement of TOSA 108 and ROSA 110 along the "x" and "z" axes. When notch 120 of TOSA 108 and notch 122 of ROSA 110 are joined with engagement member 126, TOSA 108 is coupled with port 132 and ROSA 110 is coupled with port 134.

In general, the ports 132 and 134 guide optical fiber connectors (not shown) through the housing 124 so that the optical fiber connectors are positioned to interface with the TOSA 108 and ROSA 110. In addition to port 132 and port 134, bottom part 124A of housing 124 also includes retention structure 136, or comparable structure(s), such as molded posts 137, which interface with holes 139 formed in the PCB 102 during fabrication of the PCB, and which hold PCB 102 within bottom part 124A of housing 124. Retention structure 136 or, alternatively, molded posts 137 and corresponding holes 139, also constrains movement of PCB 102 along the "x" and "z" axes.

While sub-assemblies such as the TOSA 108 and ROSA 110 are held within bottom part 124A of housing 124, top part 124B of housing 124 generally functions to secure the placement of the TOSA 108 and ROSA 110 and to establish electrical connections within housing 124. More particularly, top part 124B of housing 124 includes a structure, exemplified by engagement member 138, that cooperates with notch 120 of TOSA 108 and notch 122 of ROSA 110 to hold TOSA 108 and ROSA 110 within the housing.

In the exemplary embodiment illustrated in FIG. 1, engagement member 138 of top part 124B of housing 124 cooperates with engagement member 126 of bottom part 124B of housing 124 to position and retain TOSA 108 and ROSA 110 within the housing 124. Engagement member 138 also cooperates with engagement member 126 to constrain movement of TOSA 108 and ROSA 110 along the "y" axis. In one embodiment, engagement member 138 defines cutout portions 140 and 142, as shown in FIG. 1 by phantom lines, to facilitate retention of the TOSA 108 and ROSA 110 within the housing 124. The geometry of cutout portions 140 and 142 of engagement member 138 is generally complementary with the geometry of notch 120 of TOSA 108 and notch 122 of ROSA 110.

As indicated in FIG. 1, the top part 124B of housing 124 also includes arm 144 which extends from top part 124B of housing 124 toward bottom part 124A of housing 124 and, in general, facilitates establishment of an electrical connection between components disposed within the housing 124. More particularly, the arm 144 constrains movements of free ends 114 and 118 of electrical connectors 112 and 116 relative to contact element 104 of PCB 102. In addition to facilitating establishment of an electrical contact within the housing 124, exemplary embodiments of the arm 144, or comparable structure(s), are sufficiently mechanically compliant as to allow arm 144 to absorb any mechanical tolerance deviations in the placement of the components, such as connectors 112 and 116 and contact element 104, which the arm 144 secures. Exemplarily, the arm 144 is configured to correspond to the geometry of free end 114 of electrical connector 112 and free end 118 of electrical connector 116, as shown in FIG. 1 by phantom line 146. Of course, any other structure(s) having functionality comparable to that of arm 144 can alternatively be employed.

In one exemplary arrangement, the contact element 104 of PCB 102 is not initially in contact with the free end 114 of electrical connector 112 and free end 118 of electrical connector 116. Thus, when top part 124B and bottom part 124A of housing 124 are joined during assembly of the module 100, the arm 144 pinches free end 114 of electrical connector 112 and free end 118 of electrical connector 116 together with contact element 104 of PCB 102 so that an electrical connection is formed between the contact element 104, and the electrical connectors 116 and 118. As a result, the circuitry 106 is able to electrically communicate with the TOSA 108 and ROSA 110.

Embodiments of the invention are suitable for use in connection with a variety of other arrangements of devices within the housing 124 as well. For example, in an alternative to the arrangement just described, the contact element 104 of PCB 102 is, prior to the time that top part 124B and bottom part 124A of housing 124 are fitted together, in contact with the free end 114 of electrical connector 112 and free end 118 of electrical connector 116. In this type of arrangement, the arm 144 preserves this contact by substantially maintaining the "y" axis positions of the contact element 104 and free ends 114 and 118 of electrical connectors 116 and 112, respectively.

In either of the aforementioned arrangements, the arm 144 may be positioned and configured to allow a certain amount of relative "x" axis and/or "z" axis motion of the contact element 104 and free ends 114 and 118 of electrical connectors 116 and 112. As discussed below, this exemplary arrangement is useful in some instances.

As suggested by the preceding discussion, the arm 144 comprises an exemplary structural implementation of a means for facilitating electrical communication between two or more sub-assembly. Generally, such means serve to establish and/or maintain two or more components, such as optoelectronic subassemblies and a printed circuit board for example, in contact with each other so that electrical communication between the components is facilitated. Yet other examples of a means for facilitating electrical communication include any other part of, or attachment to, the housing 124 which establishes and/or maintains a sub-assembly or other component, in contact with another component, such as a sub-assembly, so that electrical communication between the contacting components is facilitated.

Figure 2:
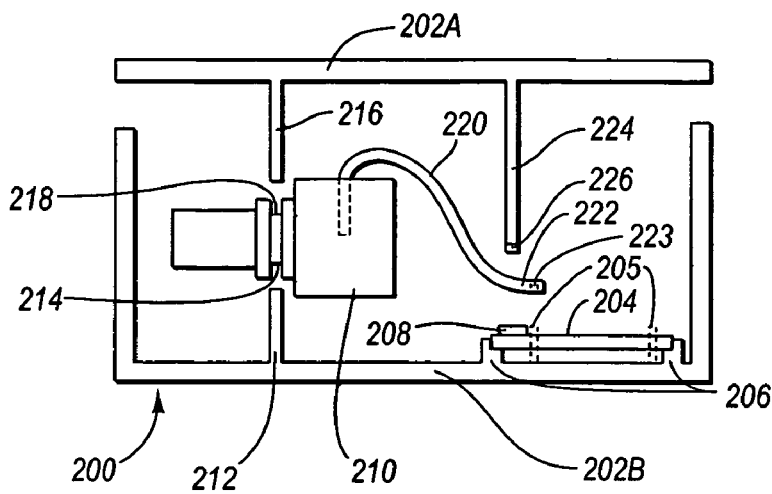
FIG. 2 is a cutaway view of the side of an exemplary housing surrounding the optical subassembly and the printed circuit board.

Directing attention now to FIG. 2, further details are provided concerning an exemplary embodiment of the invention. The exemplary module 200 includes a housing 202 having a top part 202A and a bottom part 202B, which are unattached in this view. A PCB 204 is held within bottom part 202B of the housing 202. The PCB 204 is held in place by a retention structure 206 that is part of the bottom part 202B of the housing 202. The retention structure 206 generally constrains movement of PCB 204 along the "x" and "z" axes. PCB 204 includes a contact element 208 located, for example, near one end of PCB 204.

The bottom part 202B of the housing 202 also holds an optical subassembly 210. The optical subassembly 210, which can be either a TOSA or a ROSA, is held in place within bottom part 202B of the housing 202 when engagement mechanism 212 of the bottom part 202B of the housing receives a portion of a notch 214 defined by the optical subassembly 210. The top part 202A of the housing 202 similarly includes an engagement mechanism 216 which receives a portion of the notch 214 so as to help position and retain the optical subassembly 210 securely in the housing 202. When the engagement mechanism 212 and engagement mechanism 216 receive notch 214, movement of optical subassembly 210, including tilt in the y-z and x-z planes, is substantially constrained along all axes.

Optical subassembly 210 includes an electrical connector 220 which extends from optical subassembly 210. In one embodiment, electrical connector 220 is an array of pins extending from optical subassembly 210 in a gull-wing type of arrangement, although any other electrical connector of comparable functionality or suitable configuration can be employed. The exemplary electrical connector 220 has a free end 222 located proximate contact element 208 of PCB 204. In the exemplary embodiment shown in FIG. 2, electrical connector 220 is configured and arranged so that free end 222 is positioned near contact element 208. Numerous other configurations of electrical connector 220 can be used. For example, free end 222 and contact element 208 could be configured and arranged within bottom part 202B of housing 202 so that free end 222 and contact element 208 are in contact. In this type of arrangement, and as discussed below, the free end 222 and contact element 208 are retained in that position by top part 202A of housing 202.

The top part 202A of the housing 202 includes arm 224 which extends from top part 202A of the housing 202 toward bottom part 202B of the housing 202. When top part 202A of the housing and bottom part 202B of the housing are joined, arm 224 pinches free end 222 and contact element 208 together so that an electrical connection is formed between the free end 222 and the contact element 208. In one exemplary embodiment, when arm 224 presses free end 222 of the connector 220 and contact element 208 together, arm 224 allows for some "x" and/or "z" axis movement between free end 222 and contact element 208, such as to accommodate for thermal conditions, misalignment, and flex, while at the same time, arm 224 maintains free end 222 and contact element 208 in contact with each other along the "y" axis.

In some embodiments, the arm 224, or comparable structure, is configured to substantially constrain relative motion between free end 222 and contact element 208 along the "x" and/or "z" axes. In the case that electrical connector 220 takes the form of a flexible PCB, it may be desirable to fabricate datum holes 223 into the electrical connector 220 which can be used to locate the free end of the connector 222 onto posts 205 molded into the bottom 202B of the housing 202. In the exemplary embodiment shown in FIG. 2, PCB 204 is placed into bottom part 202B of housing 202 so as to engage the molded posts 205. The free end of the connector 222 is then engaged with the molded posts 205, exemplarily by an interference fit that holds the free end of the connector 222 in position while top part 202A and bottom part 202B of the housing 202 are joined together, thereby establishing and maintaining proper alignment between free end of the connector 222 and contact element 208 during assembly.

Other exemplary embodiments involve the use of electrically non-conductive material to prevent the flow of current within module 200. In one embodiment, when top part 202A and bottom part 202B of the housing 202 are constructed of an electrically conductive material, tip 226 of arm 224 is made of electrically non-conductive material so that no current passes from either the connector 220 or contact element 208 into the housing 202 and so that no short circuits are created within the module 200. In other embodiments, top part 202A, arm 224, and/or and bottom part 202B of the housing 202 are constructed of electrically non-conductive material such that no current passes into housing 202 and so that no short circuits are created within module 200. In such an arrangement, non-conductive elements such as are exemplified by tip 226 are not required.

Figure 3:
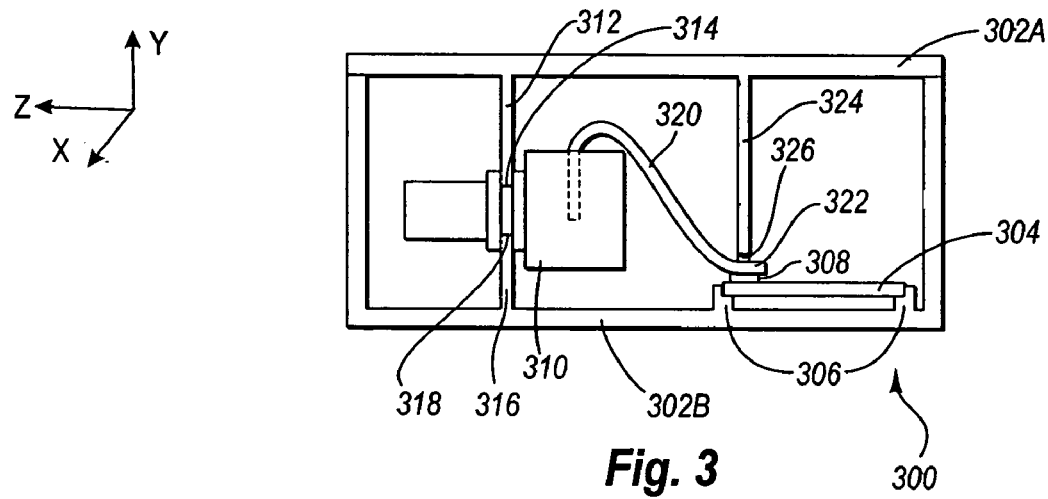
FIG. 3 shows the exemplary optical device housing of FIG. 2 with the top and bottom parts of the housing joined together.

Directing attention now to FIG. 3, details are provided concerning the stage of assembly where the top part 302A and bottom part 302B of the housing 302 are joined together. A PCB 304 is held within the housing 302 by retention structure 306, and a contact element 308 is located near one end of PCB 304.

Optical subassembly 310 is held within the housing 302 by virtue of cooperation between engagement member 312 with notch 314, and engagement member 316 with notch 318. Extending from optical subassembly 310 is electrical connector 320 which includes a free end 322. When top part 302A of the housing and bottom part 302B of the housing 302 are joined, arm 324 pinches free end 322 of electrical connector 320 and contact element 308 together, thus forming, and maintaining, an electrical connection between electrical connector 320 of optical subassembly 310 and contact element 308 of PCB 304. In particular, the electrically non-conductive tip 326 of arm 324 pushes free end 322 of electrical connector 320 into contact with contact element 308.

Figure 4:
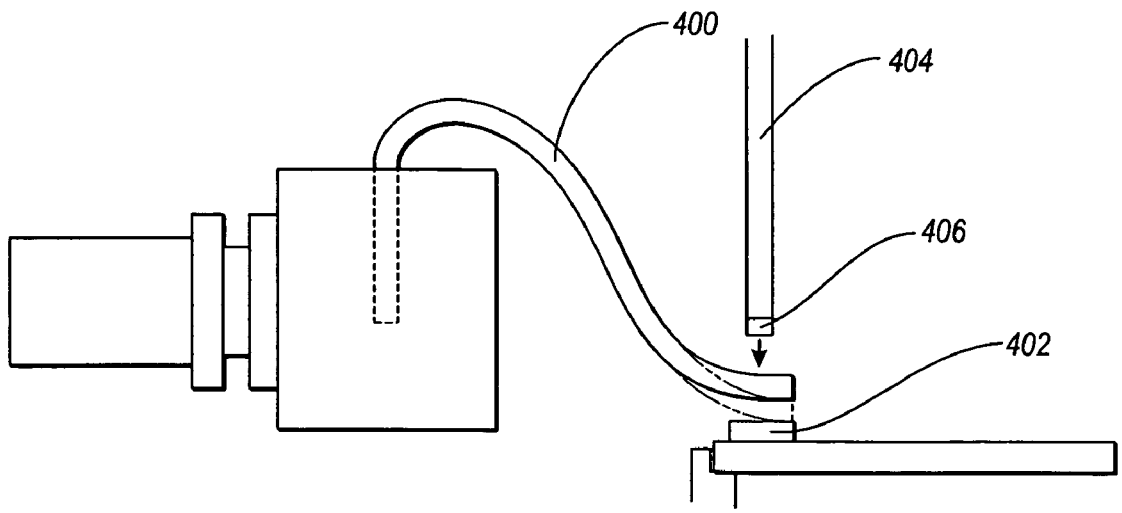
FIG. 4 is a detail view of the arm securing the electrical connector in contact with the active device on the printed circuit board.

Finally, FIG. 4 is a detail view showing electrical connector 400, contact element 402, arm 404, and electrically non-conductive tip 406 of the arm 404. Before the top part of the housing and the bottom part of the housing (see FIG. 3, for example) are joined, electrical connector 400 and arm 404 occupy the positions designated with solid lines. When the top part of the housing and the bottom part of the housing are joined together, arm 404 is moved in the direction indicated by the arrow, thus pinching electrical connector 400 and contact element 402 together, as shown by the dotted lines.

In one embodiment where the housing is constructed of an electrically conductive material, electrically non-conductive tip 406 isolates arm 404 from any current flowing through the electrical connection formed between contact element 402 and electrical connector 400. By electrically connecting optoelectronic sub-assemblies and/or other components without the use of solder, fasteners, or other types of permanent attachment, exemplary embodiments of the invention provide, among other things, an effective, low-cost and reliable mechanism for connecting opto-electronic sub-assemblies within an electrical device. Device rework is also facilitated by exemplary embodiments of the present invention since module 100 can be disassembled, and optical sub-assembly components can be removed and replaced without de-soldering and re-soldering processes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic device, comprising:
   a TOSA, wherein the TOSA is configured to transmit optical signals and wherein the TOSA includes:
      a notch on the exterior of the TOSA; and
      a first electrical connector which has a free end;
   a ROSA, wherein the ROSA is configured to receive optical signals and wherein the ROSA includes:
      a notch on the exterior of the ROSA; and
      a second electrical connector which has a free end;
   a printed circuit board, wherein the printed circuit board includes:
      circuitry configured to control the operation of the TOSA and the ROSA; and
      a contact element located on the printed circuit board, wherein:
         the contact element is in electrical communication with the circuitry of the printed circuit board;
         the contact element is located proximate the free end of the first electrical connector and free end of the second electrical connector; and
         the contact element is configured to electrically communicate with the free end of the first electrical connector and the free end of the second electrical connector; and
   a housing configured to substantially enclose the TOSA, the ROSA and the printed circuit board, wherein the housing includes:
      a first part; and
      a second part, wherein the second part is configured to join with the first part and substantially enclose the TOSA, the ROSA and the printed circuit board; and
   wherein the first part cooperates with the second part to pinch the free end of the first electrical connector together with the contact element and to pinch the free end of the second electrical connector together with the contact element when the first part of the housing is joined with the second part of the housing;
   wherein the first part and the second part of the housing are not electrically connected with the free end of the first electrical connector, the free end of the second electrical connector or the contact element of the printed circuit board;
   wherein the first part cooperates with the second part, the notch of the TOSA and the notch of the ROSA to mechanically align the TOSA and ROSA within the housing; and
   wherein the first part and the second part allow movement between the first free end and the contact element and movement between the second free end and the contact element to accommodate for at least one of thermal conditions, misalignment, and flex while maintaining the first free end and the second free end in contact with the contact element.

2. The optoelectronic device of claim 1, wherein the first electrical connector comprises a flex circuit.

3. The optoelectronic device of claim 1, wherein the first electrical connector comprises an array of pins.

4. The optoelectronic device of claim 1, wherein the first part of the housing includes an arm configured and arranged to pinch the free end of the first electrical connector together with the contact element when the first part of the housing and the second part of the housing are joined together.

5. The optoelectronic device of claim 4, wherein the arm has an electrically non-conductive tip arranged for contact with the free end of the first electrical connector.

6. The optoelectronic device of claim 1, wherein the housing includes a locating and retaining structure to position the printed circuit board and the first electrical connector such that a passive electrical connection is made before the first part of the housing and the second part of the housing are joined.

* * * * *